United States Patent

[11] 3,626,300

[72] Inventor Richard A. Kennedy
Kokomo, Ind.
[21] Appl. No. 847,291
[22] Filed Aug. 4, 1969
[45] Patented Dec. 7, 1971
[73] Assignee Detroit Motors Corporation
Detroit, Mich.

[54] IMAGE-REJECTING FREQUENCY SELECTIVE APPARATUS
4 Claims, 5 Drawing Figs.

[52] U.S. Cl. .... 325/388, 325/437, 325/489
[51] Int. Cl. .... H03h 7/10
[50] Field of Search .... 325/383, 388, 467, 489, 437; 333/75, 76; 343/175, 180

[56] References Cited

UNITED STATES PATENTS 1,950,358 3/1934 Farnham .... 325/388 X
2,259,596 10/1941 Vreeland .... 325/383 X
2,449,148 9/1948 Sands .... 325/388
3,372,337 3/1968 Beres .... 325/388

*Primary Examiner*—Benedict V. Safourek
*Attorneys*—E. W. Christen, C. R. Meland and Tim G. Jagodzinski

ABSTRACT: A frequency-selective network includes a circuit parallel resonant at a desired frequency for effectively transmitting signals at the desired frequency and a circuit series resonant at an undesired frequency for effectively attenuating signals at the undesired frequency. A variable tuning capacitor is connected in both the parallel resonant circuit and the series resonant circuit for selectively determining the desired frequency and the undesired frequency. The resonant circuit components are chosen such that the undesired frequency always differs from the desired frequency by a substantially constant frequency. Further, the resonant circuit components are chosen such that the frequency selective network tracks as a conventional tank circuit at the desired frequency.

PATENTED DEC 7 1971 3,626,300

INVENTOR.
Richard A. Kennedy
BY
C. R. Meland
ATTORNEY

IMAGE-REJECTING FREQUENCY SELECTIVE APPARATUS

This invention relates to a frequency-selective network, and more particularly to a circuit for effectively transmitting signals having a desired frequency and for effectively attenuating signals having an undesired frequency.

According to one aspect of the invention, signals having a desired frequency are transmitted or reflected while signals having an undesired frequency are attenuated or absorbed. In general, this is accomplished by providing a frequency selective network including a circuit parallel resonant at the desired frequency and a circuit series resonant at the undesired frequency.

In another aspect of the invention, the desired frequency and the undesired frequency are simultaneously determined by a common control device. Generally, this is accomplished by providing a variable tuning capacitor connected in both the parallel resonant circuit and the series resonant circuit for simultaneously tuning the parallel resonant circuit and the series resonant circuit.

According to a further aspect of the invention, the undesired frequency always differs from the desired frequency by a substantially constant frequency regardless of the tuning provided by the tuning capacitor. In general, this is accomplished by selecting the resonant circuit components so that the series resonant frequency always differs from the parallel resonant frequency by the substantially constant frequency.

In yet another aspect of the invention, the tracking characteristics of the frequency-selective network are equivalent to a conventional tank circuit at the desired frequency. Generally, this is accomplished by selecting the resonant circuit components such that the parallel resonant circuit is equivalent to a conventional tank circuit at the desired frequency.

These and other aspects of the invention will become more apparent by reference to the following detailed description of a preferred embodiment when considered in conjunction with the accompanying drawing, in which.

Figure 1:
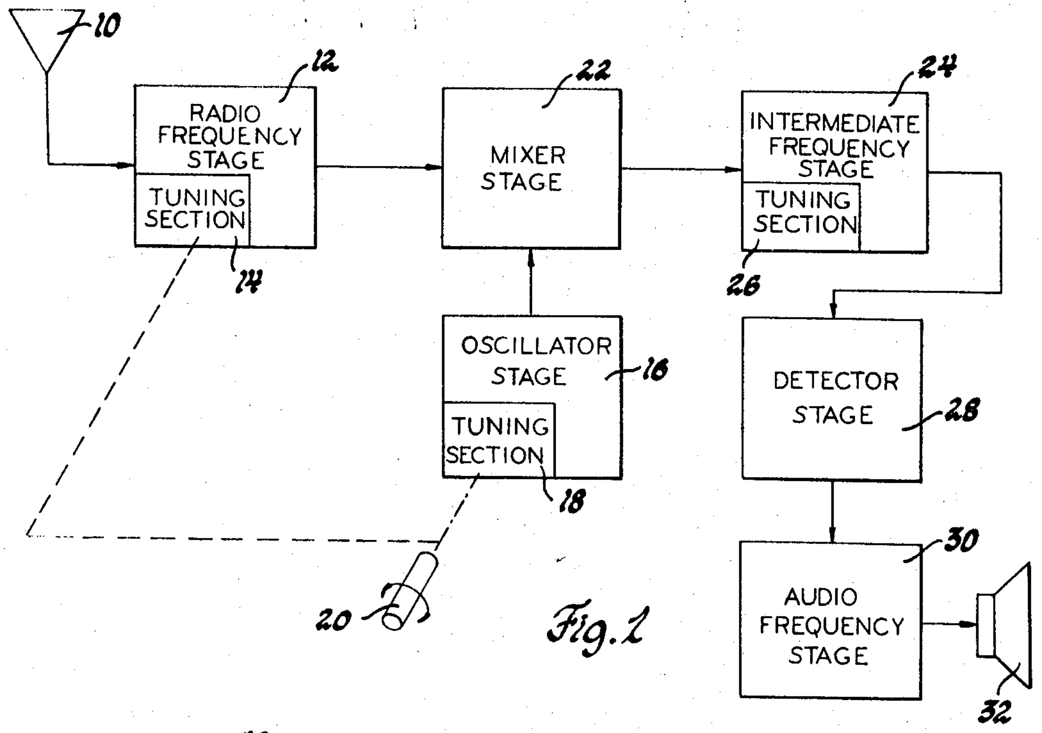
FIG. 1 is a block diagram of a conventional superheterodyne radio receiver.

Referring to FIG. 1, a conventional superheterodyne radio receiver is illustrated for receiving a desired radio frequency signal selected from within a given frequency band. The desired radiofrequency signal may contain audio information in the form of amplitude or frequency modulation. An antenna 10 is disposed within an electrical signal-propagating medium for receiving the desired radiofrequency signal from the medium. A radiofrequency stage 12 including a variable tuning section 14 is connected with the antenna 10 for amplifying the desired radiofrequency signal. The tuning section 14 tunes the radiofrequency stage 12 to the frequency of the desired radiofrequency signal. An oscillator stage 16 including a variable tuning section 18 is provided for producing a reference frequency signal. The tuning section 18 tunes the oscillator stage 16 to define the frequency of the reference frequency signal. Typically, the tuning section 14 of the radiofrequency stage 12 includes a plurality of tuned circuits while the tuning section 18 of the oscillator stage 16 includes a single tuned circuit.

A tuning control element 20 is connected with both the tuning section 14 of the radiofrequency stage 12 and with the tuning section 18 of the oscillator stage 16 for adjustably determining the frequency of the desired radiofrequency signal and the reference frequency signal. The tuning control element 20 may be mechanically or electrically coupled with a tuning capacitor or a tuning inductor in each of the tuned circuits in the tuning section 14 of the radiofrequency stage 12 and in the tuning section 18 of the oscillator stage 16. The precise function of the tuning control element 20 will be more fully explained later.

A converter or mixer stage 22 is connected with the radiofrequency stage 12 and with the oscillator stage 16 for heterodyning the desired radio frequency signal with the reference frequency signal to obtain an intermediate frequency signal. The intermediate frequency signal is amplitude or frequency modulated in the same manner as the desired radiofrequency signal so that the intermediate frequency signal contains the same audio information contained within the desired radio frequency signal. However, the frequency of the intermediate frequency signal differs from the frequency of the desired radiofrequency signal by the frequency of the reference frequency signal. An intermediate frequency stage 24 including a fixed tuning section 26 is connected with the mixer stage 22 for amplifying the intermediate frequency signal. The tuning section 26 tunes the intermediate frequency stage 24 to the frequency of the intermediate frequency signal.

A detector stage 28 is connected with the intermediate frequency stage 24 for demodulating the intermediate frequency signal to produce an audiofrequency signal representing the audio information contained within the intermediate frequency signal. An audiofrequency stage 30 is connected with the detector stage 28 for amplifying the audiofrequency signal. A speaker 32 is connected with the audiofrequency stage 30 for converting the audiofrequency electrical signal to a corresponding audiofrequency acoustical signal. Further the speaker 32 is disposed within a sound-propagating medium for transmitting the acoustical signal into the medium.

One of the problems presented by a conventional superheterodyne radio receiver is that of tuned frequency tracking. Since the tuning section 26 tunes the intermediate frequency stage 24 to a fixed intermediate frequency, the difference between the desired radiofrequency and the reference frequency must always equal the intermediate frequency. However, the tuning section 14 is responsive to movement of the control element 20 to tune the radiofrequency stage 12 to different desired radiofrequencies selected from within the given broadcast frequency band. Therefore, the tuning section 18 must be responsive to movement of the tuning control element 20 to tune the oscillator stage 16 to produce a reference frequency which continually differs from the desired radiofrequency by an amount equal to the intermediate frequency as the desired radiofrequency is varied over the given broadcast frequency band. Further, where the tuning section 14 of the radiofrequency stage 12 includes a plurality of tuned circuits, each tuned circuit must track all other tuned circuits as well as the tuned circuit in the tuning section 18 of the oscillator stage 16. It has been found that proper tuned-frequency tracking may be achieved provided that each of the tuned circuits is equivalent to a conventional tank circuit at the desired radiofrequency.

Another of the problems presented by a conventional superheterodyne radio receiver is that of image frequency response. As previously described, the difference between the desired radiofrequency and the reference frequency must constantly equal the intermediate frequency. However, there are two possible radiofrequencies which when heterodyned with the reference frequency will produce the intermediate frequency. One of the radiofrequencies is above the reference frequency by an amount equal to the intermediate frequency while the other one of the radiofrequencies is below the reference frequency by an amount equal to the intermediate frequency. Generally, for reasons which are well known to those skilled in the art, the radiofrequency below the reference frequency is treated as the desired frequency and the radiofrequency above the reference frequency is treated as the undesired or image frequency. In any event, signals at the undesired radiofrequency must be suppressed so as to avoid interference with signals at the desired radiofrequency.

Figure 2:
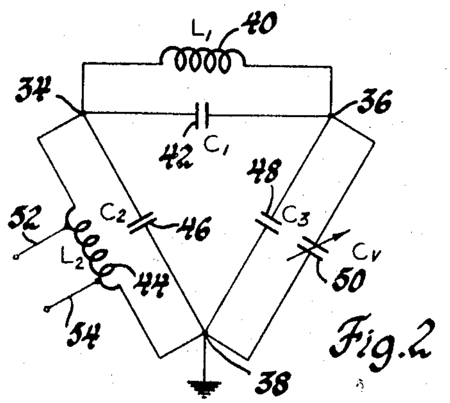
FIGS. 2 and 3 are schematic diagrams of a frequency-selective network incorporating the principles of the invention.
Figure 3:
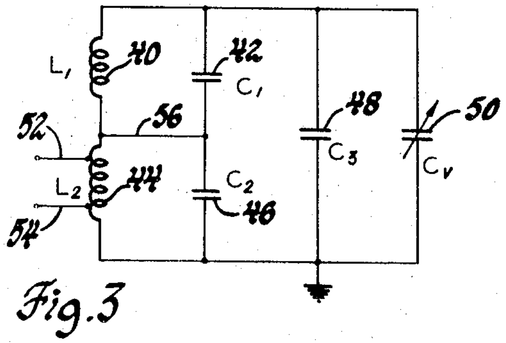

Referring to FIG. 2, a frequency-selective network is illustrated for solving the problems of tuned-frequency tracking and image frequency response in a conventional superheterodyne radio receiver. The illustrated frequency selective network includes a first terminal 34, a second terminal 36 and a third terminal 38. The third terminal 38 is connected directly to ground. A first inductor 40 having an inductance $L_1$ and a first capacitor 42 having a capacitance $C_1$ are connected in parallel between the first terminal 34 and the second terminal 36. A second inductor 44 having an inductance $L_2$ and a second capacitor 46 having a capacitance $C_2$ are connected in parallel between the first terminal 34 and the third terminal 38. A third capacitor 48 having a capacitance $C_3$ and a fourth or variable tuning capacitor 50 having a capacitance $C_V$ are connected in parallel between the second terminal 36 and the third terminal 38. The capacitance $C_V$ of the tuning capacitor 50 is variable over a range extending from a low capacitance $C_{V1}$ to a high capacitance $C_{V2}$. An input terminal 52 and an output terminal 54 are each connected to the second inductor 44. For convenience of discussion, the frequency-selective network shown in FIG. 2 is redrawn in FIG. 3. In FIG. 3, a conductor 56 is shown connecting the junction between the first and second inductors 40 and 44 with the junction between the first and second capacitors 42 and 46. However, the electrical operation of the frequency-selective network illustrated in FIG. 2 is identical to the electrical operation of the frequency-selective network illustrated in FIG. 3.

Preferably, the illustrated frequency-selective network is applied to replace one or more of the tuned circuits in the tuning section 14 of the radiofrequency stage 12 of a superheterodyne radio receiver such as that illustrated in FIG. 1. As previously described, the illustrated superheterodyne radio receiver is responsive to an intermediate frequency $f_i$ produced by heterodyning a reference frequency $f_r$ with a desired frequency $f_d$ and an undesired frequency $f_u$. Further, the desired frequency $f_d$ may range over a desired frequency band extending from a low frequency $f_{d1}$ to a high frequency $f_{d2}$. Correspondingly, the undesired frequency $f_u$ may range over an undesired frequency band extending from a low frequency $f_{u1}$ to a high frequency $f_{u2}$. The undesired frequency $f_u$ always differs from the desired frequency $f_d$ by twice the intermediate frequency $f_i$.

The tuning capacitor 50 is connected with the tuning control element 20 of the illustrated superheterodyne radio receiver for varying the capacitance $C_V$ of the tuning capacitor 50 in response to movement of the tuning control element 20. As the capacitance $C_V$ of the tuning capacitor 50 is varied over the range $C_{V2}$ to $C_{V1}$, the desired frequency $f_d$ is varied over the frequency band $f_{d1}$ to $f_{d2}$, and the undesired frequency is varied over the frequency band $f_{u1}$ to $f_{u2}$. Preferably, the tuning capacitor 50 is simultaneously varied along with other tuning capacitors incorporated within the other tuned circuits located in the tuning sections 14 and 18 of the illustrated superheterodyne radio receiver. The tuning capacitor 50 may be mechanically ganged with the other tuning capacitors as in a rotor plate tuner or may be electrically ganged with the other tuning capacitor as in a varactor tuner.

The input terminal 52 is connected to either the antenna 10 or another one of the tuned circuits in the tuning section 14 of the radio frequency stage 12 for receiving radio frequency signals having both the desired frequency $f_d$ and the undesired frequency $f_u$. In a manner which will be more fully explained later, the first and second inductors 40 and 44, and the first, second and third capacitors 42, 46 and 48 combine with the tuning capacitor 50 to form a circuit which is parallel resonant at the desired frequency $f_d$. This parallel resonant circuit conveys radiofrequency signals having the desired frequency $f_d$ from the input terminal 52 to the output terminal 54 so as to effectively transmit the radiofrequency signals. In a manner which will be more fully explained later, the first inductor 40 and the first and third capacitors 42 and 48 combine with the tuning capacitor 50 to form a circuit which is series resonant at the undesired frequency $f_u$. This series resonant circuit conveys radiofrequency signals having the undesired frequency $f_u$ from the input terminal 52 to ground so as to effectively attenuate the radiofrequency signals.

Referring again to FIG. 2, it will now be apparent that the illustrated circuit provides a relatively high impedance between the first and third terminals 34 and 38 to signals having the desired frequency $f_d$, and provides a relatively low impedance between the first and third terminals 34 and 38 to signals having the undesired frequency $f_u$. The output terminal 54 is connected with the mixer stage 22 for applying the transmitted radio frequency signals to the mixer stage 20. The input terminal 52 and the output terminal 54 may each be connected at any desired point along the second inductor 44 between the first and third terminals 34 and 38 to effect proper impedance matching. However, it will be readily appreciated that as an electrical matter, the radiofrequency signals acted upon by the illustrated frequency-selective network are developed across the first and third terminals 34 and 38 regardless of the location of the input terminal 52 or the output terminal 54 on the second inductor 44. Thus, radiofrequency signals appearing between the input terminal 52 and the third terminal 38 also appear between the first terminal 34 and the third terminal 38 and appear between the output terminal 54 and the third terminal 58. The relative position of the input and output terminals 52 and 54 along the second inductor 44 affects only the relative amplitude of the radiofrequency signals which are effectively applied and monitored across the first and third terminals 34 and 38. Further, the input and output terminals 52 and 54 may be provided by a single terminal.

Figure 4:
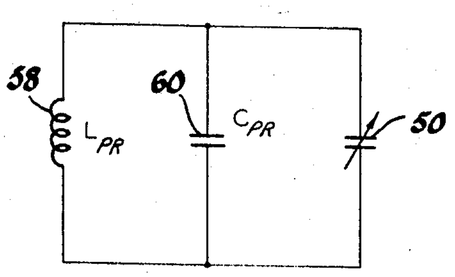
FIGS. 4 and 5 are schematic diagrams of equivalent tank circuits useful in explaining the principles of the invention.

At the desired frequency $f_d$, the frequency-selective network of FIGS. 2 and 3 operates as a conventional parallel resonant tank circuit as shown in FIG. 4. The equivalent tank circuit includes an inductor 58 having an inductance $L_{PR}$ and a capacitor 60 having a capacitance $C_{PR}$ each connected across the tuning capacitor 50. The inductance $L_{PR}$ of the inductor 58 is given by the following equation:

$$L_{PR}=L_1+L_2 \qquad (1)$$

The capacitance $C_{PR}$ of the capacitor 60 is given by the following equation:

$$C_{PR}=C_{V1}+C_3+(C_1C_2/C_1+C_2) \qquad (2)$$

However, the equations (1) and (2) are correct only if the inductances $L_1$ and $L_2$ of the first and second inductors 40 and 44, and the capacitances $C_1$ and $C_2$ of the first and second capacitors 42 and 46 are chosen so as to satisfy the following equation:

$$L_1/L_2=C_2/C_1 \qquad (3)$$

When the equation (3) is satisfied, the voltage division across the first and second inductors 40 and 44 and across the first and second capacitors 42 and 46 is equal so that no current flows through the conductor 56. Accordingly, the conductor 56 is disregarded in deriving the equivalent tank circuit shown in FIG. 4. With the conductor 56 removed, it will be readily observed that the illustrated frequency-selective network satisfies equations (1) and (2).

As previously described, the illustrated frequency-selective network must be equivalent to a conventional tank circuit at the desired frequency $f_d$ for proper tracking. However, the illustrated frequency selective network is equivalent to a conventional tank circuit at the desired frequency $f_d$ only if equation (3) is satisfied. Therefore, equation (3) represents the tracking criteria for the illustrated frequency-selective network. In other words, the illustrated frequency-selective network tracks properly as a conventional tank circuit only when the ratio of the inductance $L_1$ of the first inductor 50 to the inductance $L_2$ of the second inductor 44 equals the ratio of the capacitance $C_2$ of the second capacitor 46 to the capacitance $C_1$ of the first capacitor 42.

Figure 5:
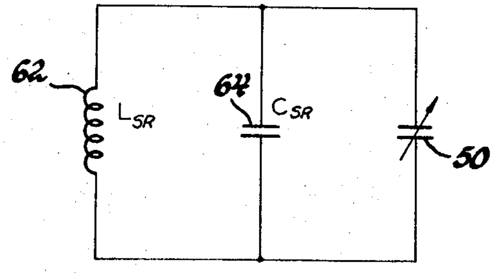

At the undesired radiofrequency $f_u$, the frequency-selective network of FIGS. 2 and 3 operates as a conventional series resonant tank circuit as shown in FIG. 5. The equivalent tank circuit includes an inductor 62 having an inductance $L_{SR}$ and a capacitor 64 having a capacitance $C_{SR}$ each connected across the tuning capacitor 50. The inductance $L_{SR}$ of the inductor 62 is given by the following equation:

$$L_{SR}=L_1 \qquad (4)$$

The capacitance $C_{SR}$ of the capacitor 64 is given by the following equation:

$$C_{SR}=C_{v1}+C_1+C_3 \qquad (5)$$

The second inductor 44 and the second capacitor 46 do not form a part of the series resonant circuit. Accordingly, the second inductor 44 and the second capacitor 46 are disregarded in deriving the equivalent tank circuit of FIG. 5. With the second inductor 44 and the second capacitor 46 removed, it will be readily observed that the illustrated frequency-selective network satisfies equations (4) and (5).

Further, the equivalent tank circuit of FIG. 4 may be described by the following equations:

$$L_{PR}=\frac{1}{(2\pi f_{d2})^2 C_{PR}} \qquad (6)$$

$$\frac{f_{d2}}{f_{d1}}=\sqrt{\frac{(C_{V2}-C_{V1})+C_{PR}}{C_{PR}}} \qquad (7)$$

The equations (6) and (7) define the relationships between the inductance $L_{PR}$ of the inductor 58, the capacitance $C_{PR}$ of the capacitor 60 and the capacitance range $C_{v2}$–$C_{v1}$ of the tuning capacitor 50 necessary to achieve parallel resonance over the frequency band $f_{d1}$ to $f_{d2}$. Substituting equations (1) and (2) in equation (6) yields the following equation:

$$L_1+L_2=\frac{1}{(2\pi f_{d2})^2\left(C_{v1}+C_3+\frac{C_1C_2}{C_1+C_2}\right)} \qquad (8)$$

Substituting Equation (2) in Equation (7) yields the following equation:

$$\frac{f_{d2}}{f_{d1}}=\sqrt{\frac{(C_{v2}-C_{v1})+\left(C_{v1}+C_3+\frac{C_1C_2}{C_1+C_2}\right)}{\left(C_{v1}+C_3+\frac{C_1C_2}{C_1+C_2}\right)}} \qquad (9)$$

Similarly, the equivalent tank circuit of FIGURE 5 may be described by the following equations:

$$L_{SR}=\frac{1}{(2\pi f_{u2})^2 C_{SR}} \qquad (10)$$

$$\frac{f_{u2}}{f_{u1}}=\sqrt{\frac{(C_{v2}-C_{v1})+C_{SR}}{C_{SR}}} \qquad (11)$$

The equations (10) and (11) define the relationship between the inductance $L_{SR}$ of the inductor 62, the capacitance $C_{SR}$ of the capacitor 64 and the capacitance range $C_{v2}$–$C_{v1}$ of the tuning capacitor 50 necessary to achieve series resonance over the frequency band $f_{u1}$ to $f_{u2}$. Substituting equations (1) and (2) in equation (10) yields the following equation:

$$L_1=\frac{1}{(2\pi f_{u2})^2(C_1+C_{v1}+C_3)} \qquad (12)$$

Substituting Equation (2) in Equation (11) yields the following equation:

$$\frac{f_{u2}}{f_{u1}}=\sqrt{\frac{(C_{v2}-C_{v1})(C_1+C_{v1}+C_3)}{(C_1+C_{v1}+C_3)}} \qquad (13)$$

It will now be appreciated that equations (3), (8), (9), (12), and (13) may be solved simultaneously to obtain the values of the inductances $L_1$ and $L_2$ of the first and second inductances 40 and 44, and to obtain the values of the capacitances $C_1$, $C_2$, and $C_3$ of the first, second, and third capacitors 42, 46, and 48. The capacitance range $C_{v2}$–$C_{v1}$ of the tuning capacitor 50 is a specified value. Similarly, the desired frequency band $f_{d1}$ to $f_{d2}$ and the undesired frequency band $f_{u1}$ to $f_{u2}$ are also specified values.

In a frequency-selective network designed for use in a superheterodyne radio receiver where the following values were specified:

| | | |
|---|---|---|
| $C_{v2}C_{v1}$ | = | 140 pf. |
| $f_{d1}$ | = | 5880 kHz. |
| $f_d$ | = | 10,200 kHz. |
| $f_{u1}$ | = | 6790 kHz. |
| $f_{u2}$ | = | 11,110 kHz. |

the following inductance and capacitance values were calculated, tested, and found to yield satisfactory results:

| | | |
|---|---|---|
| $L_1$ | = | 2.5 μh. |
| $L_2$ | = | 1.0 μh. |
| $C_1$ | = | 44 pf. |
| $C_2$ | = | 110 pf. |
| $C_3$ | = | 38.5 pf. |

Although the illustrated frequency-selective network was described as incorporated within a superheterodyne radio receiver, it is to be understood that the invention is not limited to applications involving a heterodyne apparatus. The illustrated frequency selective network may be employed whenever it is necessary to simultaneously transmit a desired frequency signal and attenuate an undesired frequency.

What is claimed is:

1. A frequency-selective network comprising: first, second and third terminals; a source of electrical signals connected to the first terminal; a source of reference potential connected to the third terminal; a first inductor and a first capacitor connected in parallel between the first and second terminals; a second inductor and a second capacitor connected in parallel between the first and third terminals; and a third capacitor and a fourth capacitor connected in parallel between the second and third terminals; the first and second inductors and the first, second, third, and fourth capacitors forming a circuit parallel resonant at a first frequency to provide a maximum impedance to signals of the first frequency effectively applied between the first and third terminals; and the first inductor and a first, third, and fourth capacitors forming a circuit series resonant at a second frequency to provide a minimum impedance to signals of the second frequency effectively applied between the first and third terminals.

2. A frequency-selective network comprising; a first inductor; a second inductor connected in series with the first inductor; a first capacitor connected in parallel with the first inductor; a second capacitor connected in parallel with the second inductor; a third capacitor connected in parallel with the first and second capacitors; a variable capacitor connected in parallel with the third capacitor; a source of electrical signals connected to the junction between the first and second inductors; a source of reference potential connected to the junction between the second inductor and the second capacitor; the first and second inductors and the first, second, third, and variable capacitors forming a circuit parallel resonant at a first frequency determined as a function of the capacitance of the variable capacitor thereby to provide a relatively high impedance to signals of the first frequency; the first inductor and the first, third, and variable capacitors forming a circuit series resonant at a second frequency determined as a function of the capacitance of the variable capacitor thereby to provide a relatively low impedance to signals of the second frequency; and control means connected with the variable capacitor for varying the capacitance of a variable capacitor to simultaneously vary the first frequency and the second frequency.

3. In an electrical system including an input circuit providing electrical signals of varying frequency and an output circuit responsive to electrical signals of a first frequency and electrical signals of a second frequency where the second frequency differs from the first frequency by a substantially constant amount; a frequency-selective network comprising: first, second, and third terminals; a source of electrical signals connected to the first terminal; a source of reference potential connected to the third terminal; a first inductor and a first capacitor connected in parallel between the first and second terminals; a second inductor and a second capacitor connected in parallel between the first and third terminals; a third capacitor and a tuning capacitor connected in parallel between the second and third terminals; the inductance of the first and second inductors and the capacitance of the first, second, third, and tuning capacitors selected so that the first and second inductors and the first, second, third, and tuning capacitors form a circuit parallel resonant at the first frequency to provide a maximum impedance between the first and third terminals to electrical signals of the first frequency so that the first frequency electrical signals are substantially unaffected; the inductance of the first inductor and the capacitance of the first, third, and tuning capacitors further selected so that the first inductor and the first, third, and tuning capacitors form a circuit series resonant at the second frequency to provide a minimum impedance between the first and third terminals to electrical signals of the second frequency so that the second frequency electrical signals are substantially attenuated; output terminal means connecting the output circuit to the second inductor to effectively apply the first frequency electrical signals to the output circuit; and control means connected with the tuning capacitor for varying the capacitance of the tuning capacitor to simultaneously vary the first frequency and the second frequency; the inductance of the first and second inductors and the capacitance of the first and second capacitors further selected so that the ratio of the inductance of the first inductor to the inductance of the second inductor equals the ratio of the capacitance of the second capacitor to the capacitance of the first capacitor so that the frequency selective network tracks as a conventional tank circuit at the first frequency.

4. In the radiofrequency stage of a superheterodyne radio receiver responsive to radio signals of a desired frequency $f_d$ and an undesired frequency $f_u$ where the undesired frequency $f_u$ differs from the desired frequency $f_d$ by twice the intermediate frequency $f_i$ of the radio receiver; a frequency selective network comprising: first, second, and third terminals; a first inductor having an inductance $L_1$ and a first capacitor having a capacitance $C_1$ connected in parallel between the first and second terminals; a second inductor having an inductance $L_2$ and a second capacitor having a capacitance $C_2$ connected in parallel between the first and third terminals; a third capacitor having a capacitance $C_3$ and a tuning capacitor having a capacitance $C_V$ connected between the second and third terminals; and control means connected with the tuning capacitor for varying the capacitance $C_V$ over a range extending from a high capacitance $C_{V2}$ to a low capacitance $C_{V1}$ to vary the desired frequency $f_d$ over a frequency band extending from a low frequency of $f_{d1}$ to a high frequency of $f_{d2}$ and to vary the undesired frequency $f_u$ over a frequency band extending from a low frequency $f_{u1}$ to a high frequency $f_{u2}$; input terminal means connected to the second inductor for effectively applying radio signals across the first and third terminals; and output terminal means connected to the second inductor for effectively monitoring radio signals developed across the first and third terminals; the inductances $L_1$ and $L_2$ and the capacitances $C_1$, $C_2$, $C_3$, and $C_V$ selected so as to satisfy the following equations:

$$L_1+L_2=\frac{1}{(2\pi f_{d2})^2\left(C_{v1}+C_3+\frac{C_1C_2}{C_1+C_2}\right)}$$

$$\frac{f_{d2}}{f_{d1}}=\sqrt{\frac{(C_{v2}-C_{v1})+\left(C_{v1}+C_3+\frac{C_1C_2}{C_1+C_2}\right)}{\left(C_{v1}+C_3+\frac{C_1C_2}{C_1+C_2}\right)}}$$

so that the first and second inductors and the first, second, third, and tuning capacitors form a circuit parallel resonant at the desired frequency $f_d$ thereby to provide a maximum impedance between the first and third terminals to radio signals of the desired frequency $f_d$; the inductance $L_1$ and the capacitances $C_1$, $C_3$, and $C_V$ further selected so as to satisfy the following equations:

$$L_1=\frac{1}{(2\pi f_{u2})^2(C_1+C_3)}$$

$$\frac{f_{u2}}{f_{u1}}=\sqrt{\frac{(C_{v2}-C_{v1})(C_1+C_{v1}+C_3)}{(C_1+C_{v1}+C_3)}}$$

so that the first inductor and the first, third, and tuning capacitors form a circuit series resonant at the undesired frequency $f_u$ thereby to provide a minimum impedance between the first and third terminals to radio signals of the undesired frequency $f_u$; the inductances $L_1$ and $L_2$ and the capacitances $C_1$ and $C_2$ further selected so as to satisfy the following equation:

$$L_1/L_2=C_2/C_1$$

so that the frequency-selective network tracks as a conventional tank circuit at the desired frequency $f_d$.

* * * * *

PO-1050
(5/69)

UNITED STATES PATENT OFFICE
CERTIFICATE OF CORRECTION

Patent No. 3,626,300 Dated December 7, 1971

Inventor(s) Richard A. Kennedy

It is certified that error appears in the above-identified patent and that said Letters Patent are hereby corrected as shown below:

Assignee: "Detroit Motors Corporation" should be
-- General Motors Corporation --.

Signed and sealed this 28th day of November 1972.

(SEAL)
Attest:

EDWARD M.FLETCHER,JR.
Attesting Officer

ROBERT GOTTSCHALK
Commissioner of Patents